United States Patent [19]
Dunn et al.

[11] Patent Number: 5,882,977
[45] Date of Patent: Mar. 16, 1999

[54] METHOD OF FORMING A SELF-ALIGNED, SUB-MINIMUM ISOLATION RING

[75] Inventors: James S. Dunn, Jericho; Stephen A. St. Onge, Essex Junction, both of Vt.

[73] Assignee: International Business Machines Corporation, Armonk, N.Y.

[21] Appl. No.: 944,206

[22] Filed: Oct. 3, 1997

[51] Int. Cl.$^6$ .................................................. H01L 21/331
[52] U.S. Cl. .......................................... 438/353; 438/423
[58] Field of Search ................................... 438/357, 356, 438/423, 160, 312

[56] References Cited

U.S. PATENT DOCUMENTS

| | | |
|---|---|---|
| 4,228,448 | 10/1980 | Lalumia et al. . |
| 4,333,794 | 6/1982 | Beyer et al. . |
| 4,767,723 | 8/1988 | Hinsberg, III et al. ................ 438/160 |
| 4,868,135 | 9/1989 | Ogura et al. . |
| 5,027,183 | 6/1991 | Dreps . |
| 5,087,579 | 2/1992 | Tomassetti . |
| 5,206,182 | 4/1993 | Freeman . |
| 5,382,824 | 1/1995 | Popovic . |
| 5,496,745 | 3/1996 | Ryum et al. . |
| 5,580,798 | 12/1996 | Grubisic . |
| 5,656,414 | 8/1997 | Chou et al. ............................. 430/312 |

*Primary Examiner*—Charles Bowers
*Assistant Examiner*—Craig Thompon
*Attorney, Agent, or Firm*—Delio & Peterson, LLC; Peter W. Peterson; Eugene I. Shkurko

[57] ABSTRACT

An isolation method in which an isolation ring is formed to isolate a semiconductor device from other semiconductor devices on a common substrate. The method is suitable for isolating bipolar devices from CMOS or other devices formed on the same substrate and for preventing base current from being injected into the substrate. The method starts with a substrate having a buried sub-collector and a first isolation region that surrounds the portion of the surface to contain the semiconductor device. The first isolation region extends only part of the distance from the surface towards the buried sub-collector. Layers of polysilicon and dual-tone resist are applied, and a first mask is used with an opaque area aligned over the portion of the surface to contain the semiconductor device. The edge of the opaque region terminates above the first isolation region. After exposure, the properties of the dual-tone resist allow a narrow sub-minimum width trench to be removed from the resist to define an isolation ring. Ion implantation is then used to form a second isolation region extending to the sub-collector to form the isolation ring. Blanket exposure of the resist and further processing allows the semiconductor device to be formed within and automatically aligned with the isolation ring.

16 Claims, 2 Drawing Sheets

METHOD OF FORMING A SELF-ALIGNED, SUB-MINIMUM ISOLATION RING

BACKGROUND OF THE INVENTION

1. Field of the Invention

This invention relates to a method of isolating semiconductor devices constructed on a common substrate. The invention is particularly useful in Bi-CMOS applications in which bipolar semiconductor devices must be isolated from each other and from CMOS devices.

2. Description of Related Art

Bi-CMOS technology permits bipolar and CMOS transistors to be constructed on a common semiconductor substrate. The combination of these two types of devices provides higher performance than CMOS devices alone, without the higher power consumption that would be required for a device constructed entirely from bipolar transistors.

One of the difficulties encountered in implementing bi-CMOS technology is isolating the bipolar devices from other devices on the common substrate. Shallow trench isolation (STI), which may be used for isolation of the CMOS elements, does not provide sufficient isolation for minimum size bipolar devices.

Bipolar devices constructed over a buried sub-collector can be partially isolated with the same STI regions used to isolate the CMOS elements. However, the isolation provided by the STI region is insufficient to prevent current leakage under the STI region. This current leakage seriously degrades device performance. Several approaches have been employed to eliminate the leakage path.

One solution is to use deep trench isolation, deeper than a typical STI region and sufficiently deep that the isolation region extends from the surface to the buried sub-collector. Another approach is to use a thin epitaxial layer such that the depth of the STI isolation region is sufficient to contact the buried sub-collector.

Another solution to the leakage problem is to form a second lightly doped n-type region by ion implantation to the structure above the subcollector. Yet another approach which has been tried, is the use of an additional mask to form an n+ isolation ring under the STI isolation region. All of these approaches, while partially successful, add process complexity, decrease device performance or increase device size.

Bearing in mind the problems and deficiencies of the prior art, it is therefore an object of the present invention to provide a method of isolating semiconductor devices that minimizes additional process complexity and avoids increasing device size.

It is another object of the present invention to provide a method of isolating semiconductor devices wherein the isolation region is automatically aligned relative to the semiconductor device to be isolated by that region.

A further object of the invention is to provide a method of forming the isolation region using dual-tone resist which has the capability of defining three separate regions with a single mask.

Still other objects and advantages of the invention will in part be obvious and will in part be apparent from the specification.

SUMMARY OF THE INVENTION

The above and other objects, which will be apparent to one skilled in the art, are achieved in the present invention which relates to an isolation method in which an isolation ring is formed to isolate a semiconductor device to be formed on a semiconductor substrate.

In one aspect the isolation method of the invention includes the following steps:

A substrate is provided having a sub-collector buried below the surface of the substrate. A first isolation region extends part of the distance from the surface towards the buried sub-collector. The first isolation region is preferably an STI isolation region.

A layer of dual-tone resist is applied to the substrate. Dual-tone resist, also referred to as frequency doubling resist, has the capability of patterning three distinct regions when it is masked and then exposed. The first region is the area beneath opaque portions of the mask which receives little or no illumination during exposure. The second region is the area beneath the transparent mask areas which receives heavy illumination during exposure. The third region is the narrow area directly beneath or very near the edges of the opaque mask areas, where the illumination level is intermediate due to bleed through and diffraction from the edges of the mask.

The dual-tone resist exposed using a first mask having an opaque area with an edge which terminates a preselected distance from an edge of the first isolation region.

The dual-tone resist is developed and the portion of the dual-tone resist which received the intermediate illumination during exposure, i.e., the portion of the dual-tone resist located in the vicinity of the edge of the first mask, is removed.

A second isolation region is then formed by implantation using the remaining portions of the dual-tone resist as a second mask. The second isolation region extends from the first isolation region to the sub-collector.

After the steps above, the portions of the dual-tone resist that were beneath the first mask may be removed. This removal is preferably achieved by blanket exposing the resist, followed by developing and removing the portions of the resist that were beneath the opaque portion of the first mask.

A doped semiconductor region is then formed in the exposed substrate. Formation is preferably accomplished with ion implantation. When formed, the doped semiconductor region is automatically aligned, i.e., self aligned, relative to the second isolation region.

In another aspect of the invention, the substrate may have a layer of polysilicon applied before the layer of resist is formed. The polysilicon layer may be etched to expose the substrate, or ion implantation may proceed through the polysilicon layer.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 1 is a cross sectional view of a substrate having a surface, a sub-collector buried below the surface, and a first isolation region that extends part of the distance from the surface towards the buried sub-collector.

FIG. 2 is a cross sectional view of the substrate in FIG. 1 to which layers of polysilicon and dual-tone resist have been applied, and above which a first mask is located.

FIG. 3 is a cross sectional view of the substrate in FIG. 2 after exposure of the dual-tone resist, and after removal of the photoresist at the edges of the first mask.

FIG. 4 is a cross sectional view of the substrate in FIG. 3 after a blanket exposure and removal of additional resist.

FIG. 5 is a cross sectional view showing emitter, base and collector regions of a bipolar device isolated according to the method of the present invention.

DESCRIPTION OF THE PREFERRED EMBODIMENT(S)

In describing the preferred embodiment of the present invention, reference will be made herein to FIGS. 1–5 of the drawings in which like numerals refer to like features of the invention.

Figure 1:
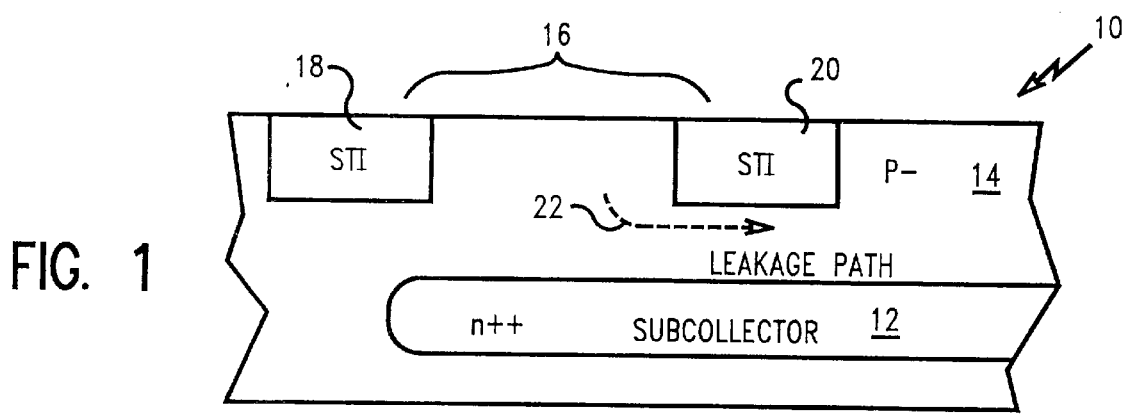
FIGS. 1–5 are cross sectional views illustrating various steps in the fabrication sequence of a typical semiconductor device isolated from other devices according to the method of the invention.

FIG. 1 illustrates the preferred starting point for the present invention in which a substrate generally indicated with reference numeral 10 includes a buried n++ sub-collector 12. The sub-collector 12 is covered with a p-semiconductor region 14 preferably grown epitaxially.

A portion of the surface of the epitaxial region indicated with reference numeral 16 is to be used to form a semiconductor device, preferably a bipolar semiconductor device. This portion of the surface 16, is surrounded by a first isolation region, two portions of which 18, 20 can be seen on opposite sides of region 16 in all the cross-sectional views of FIGS. 1–5.

The first isolation region 18, 20 surrounds and defines the area 16 where the semiconductor device is to be constructed and provides some isolation between that area and adjacent regions to be used for the formation of additional semiconductor devices. As shown in FIG. 1, however, the first isolation region extends only part of the distance from the surface towards the sub-collector 12. If a semiconductor device is formed in region 16, there is a leakage path indicated with reference numeral 22 which allows objectionable leakage current to flow between the first isolation region and the buried sub-collector 12.

This leakage path can be cut off by deepening the first isolation region until it contacts the buried sub-collector 12. However, this adds process complexity and has other undesirable results. In the present invention, this leakage path is cut off by forming a second isolation region 24, 26 (refer to FIGS. 2–5). The second isolation region is formed by ion implantation to form an n+ isolation ring. Which extends to the buried sub-collector 12.

The isolation "ring" referred to here may be of any shape which surrounds the area 16 to provide the necessary isolation. Typically, this area 16 will be square or rectangular in shape, although other shapes are possible.

Figure 2:
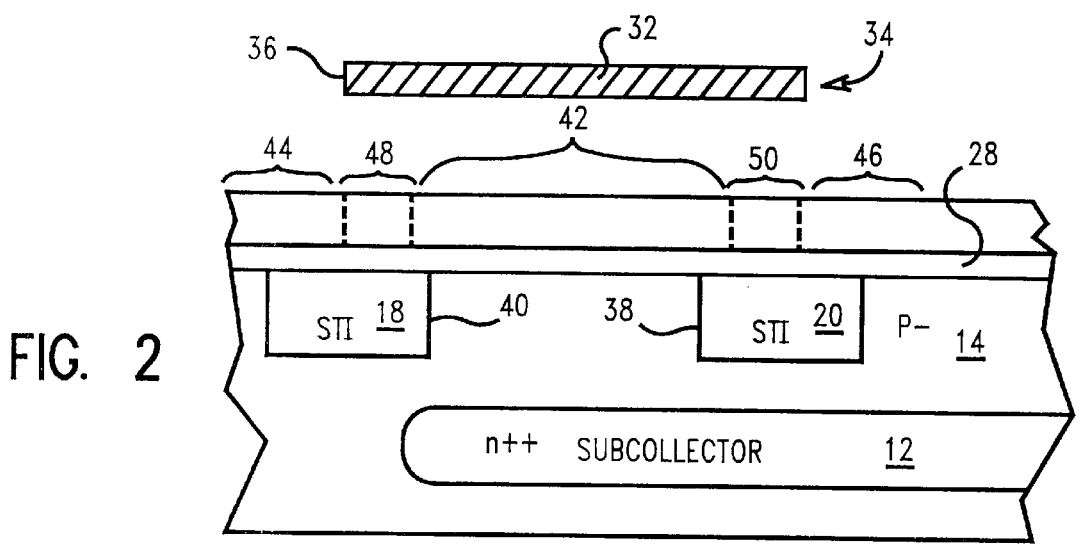

FIG. 2 shows the substrate after several additional steps have been completed. A layer of polysilicon 28 has been formed on the surface of the epitaxial layer 14. Above that, a layer of dual-tone photoresist 30 has been applied, and above the dual-tone resist a first mask 32 has been positioned ready for exposure of the photoresist.

The polysilicon layer, although useful in many processing implementations, is optional, and may be eliminated, if desired. Where it is incorporated, as shown, portions of it may be etched away when overlying portions of the photoresist are removed. This allows the polysilicon to assist the masking function of the resist 30. Alternatively, where ion implantation techniques are used, the polysilicon may be left in place with the ion implantation being done with sufficient energy to penetrate the polysilicon layer and complete the desired implantation.

A first mask 32 is shown as an opaque portion positioned above the substrate. The opaque portion of the mask has edges 34, 36 positioned a preselected horizontal distance away from the inner edges 38, 40 of the first isolation region 18, 20. The preselected distance from the edge of the mask to the inner edge of the first isolation region is chosen so that the second isolation region will be of the desired size and position relative to the first isolation region and the area 16 within it.

The preselected distance to be chosen is affected by the properties of the dual-tone resist and the frequency of the radiation used to expose it. Dual-tone resist, also referred to as "frequency doubling resist", is a recently developed type of photoresist, which has the capability of defining three distinct regions during a single exposure. A complete description of dual-tone resist is provided in U.S. patent application Ser. No. 08/715,287 filed Sep. 16, 1996, and entitled "Frequency Doubling Hybrid Photoresist". That application is assigned to the assignee of the present invention, International Business Machines Corporation, and the disclosure therein is incorporated herein by reference.

Briefly described, the dual-tone resist has three states depending upon the level of illumination it receives during exposure. The first state is the unexposed state. The second state is the lightly exposed state. The third state is the heavily exposed state. Only lightly exposed dual-tone resist is removed after exposure and development. Heavily exposed resist and unexposed resist remain on the substrate surface.

This three state property is used to provide two advantageous features for the isolation ring of the present invention. The first is the production of a sub-minimum width isolation ring. The dimensions of other features on the substrate are controlled by the minimum width of opaque features in the mask used during production. However, the width of the isolation ring produced by this method is controlled by the frequency of the light illuminating the mask 32. This frequency affects the diffraction of light off the edges of the opaque portion of the mask.

The second advantageous feature achieved through the use of dual-tone resist is self-alignment between the isolation ring produced by this method and the semiconductor device to be formed within that ring. The photoresist is exposed twice and used as a mask twice. In the first use, it is given heavy exposure and diffraction off the mask produces the isolation ring. In the second use, light blanket exposure with no mask allows the previously unexposed area to be removed. This permits the semiconductor device to be formed with perfect alignment within the isolation ring.

Referring to FIG. 2, the portion of the dual-tone resist 30 which underlies mask 34 is indicated with reference numeral 42. This portion will remain in the dark and unexposed (the first state described above) during heavy exposure. The unexposed area form the positive tone region 42, seen in FIG. 3.

Figure 3:
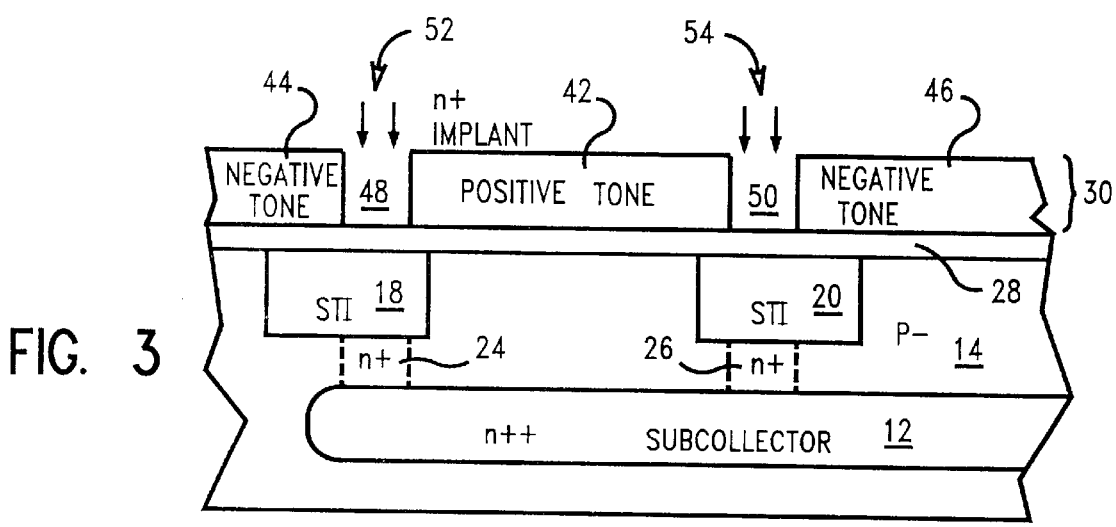

The portions of the photoresist to the far left and right sides of mask 32 directly receive the heavy exposure (the third state for the photoresist as described above) and will form negative tone regions 44, 46 as shown in FIG. 3. Both the positive tone and the negative tone portions will remain on the substrate after development of the resist. However, the transition regions between region 42 and region 44 and between regions 42 and 46, as marked with reference numerals 48 and 50, will be partially illuminated by diffracted light off the edges 34, 36 of the mask. The width of these partially illuminated areas is controlled by the frequency of the light illuminating the mask.

The partially illuminated regions 48, 50 will be lightly exposed and are removed after development of the photoresist, exposing the polysilicon layer 28. The width regions 48, 50 will be sub-minimum, i.e. less than the minimum width of other features when an appropriate selection for the frequency of the illuminating radiation is chosen.

FIG. 3 illustrates the relative positions of the positive tone region 42, the negative tone regions 44, 46 and the removed regions 48, 50 of the photoresist 30. After the dual-tone resist has been developed, and portions 48, 50 removed, the photoresist 30 forms a second mask. If preferred, the polysilicon layer may be etched to expose the surface of the epitaxial layer 14. At this stage, the photoresist has one or more narrow trenches formed in it which follow the edges of any opaque regions in mask 32. Typically, the mask 32 will have numerous adjacent opaque portions defining the locations for the semiconductor devices to be formed. Each opaque area will be a single contiguous area, and the trench formed in the photoresist will outline the perimeter of that area.

The second mask formed by the photoresist is used to produce the second isolation region comprising regions 24, 26 when the photoresist and underlying substrate are exposed to an n+ ion implant beam indicated with arrows 52, 54. The ion implant beam penetrates the STI regions 18, 20 to form the second isolation regions 24, 26.

At this point, the isolation ring formed by the combination of the first and second isolation regions is complete. However, in the preferred embodiment, the dual-tone resist 30 is used again, in a second exposure step, to automatically align the semiconductor device to be created in region 16 with the isolation ring formed by regions 18, 20, 24 and 26.

To achieve this self-alignment, the dual-tone resist is subjected to a blanket illumination, without any mask, at an intensity level below that of the illumination used in the previous step. Because the mask 32 no longer protects the positive tone region 42, this blanket illumination at an intermediate level exposes that region and converts it to the second lightly exposed state described above.

Upon subsequent development, the entire positive tone region 42, i.e., the additional portions of the dual-tone resist that were beneath the first mask during the step of exposing the dual-tone resist, are removed. The polysilicon layer 28 is then preferably etched to expose the substrate.

Figure 4:
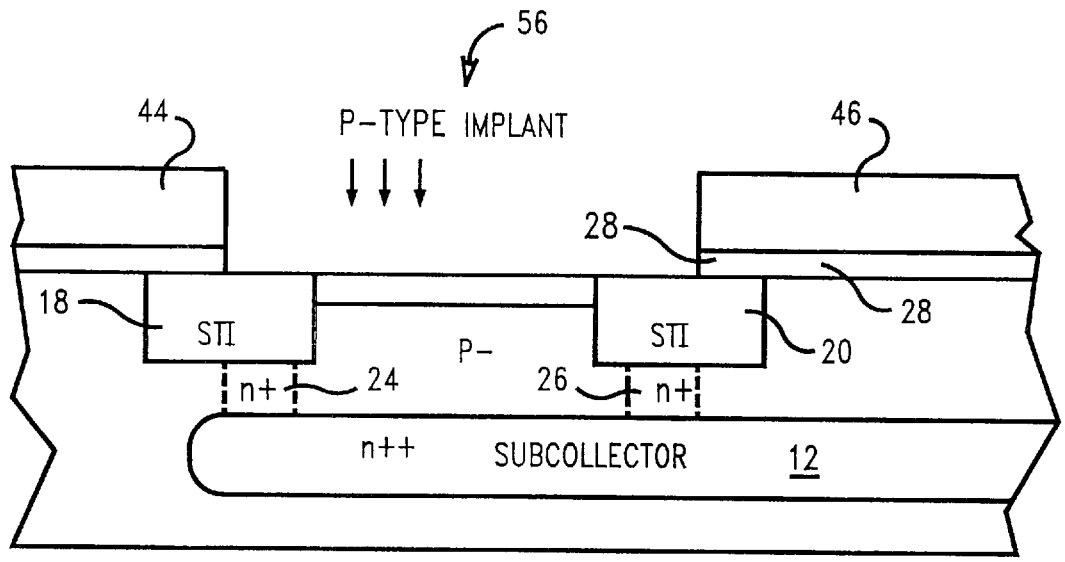

This stage of the process is shown in FIG. 4. After removal of the polysilicon underneath regions 42, 48 and 50, p type ion implant beam 56 is used to produce a p type region 58 suitable for use as the intrinsic base of a bipolar semiconductor. Region 58 is automatically aligned with the isolation ring formed in the previous step.

Figure 5:
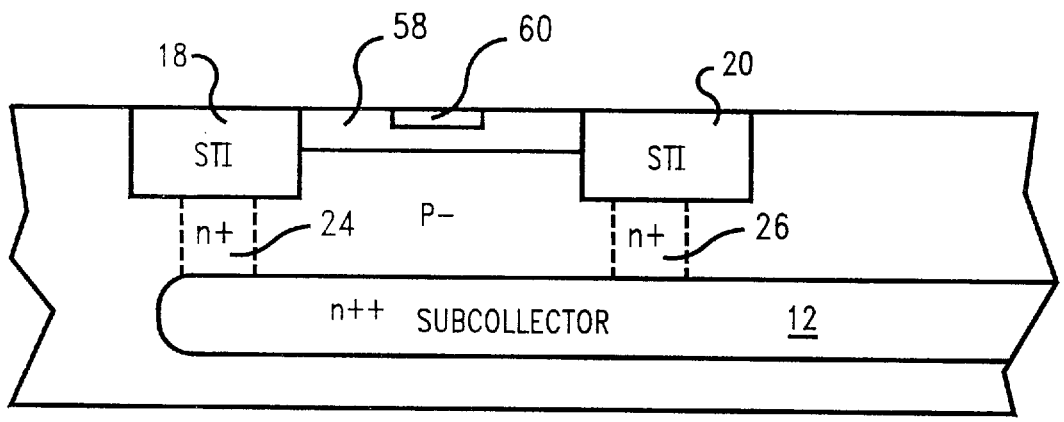

FIG. 5 shows the emitter, base and collector regions of a bipolar device in which an n+emitter region 60 has been formed in the p type base region 58. Region 60 may be formed by any of various, well-known methods, including by ion implantation.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An isolation method comprising the steps of:
   providing a substrate having a surface, a sub-collector buried below the surface, and a first isolation region that extends part of the distance from the surface towards the buried sub-collector;
   applying a layer of dual-tone resist over the substrate;
   exposing the dual-tone resist using a first mask having an edge terminating a preselected distance from an edge of the first isolation region;
   developing the dual-tone resist and removing a portion of the resist located in the vicinity of the edge of the first mask; and
   forming a second isolation region by implantation using the remaining portions of the dual-tone resist as a second mask, the second isolation region extending from the first isolation region to the sub-collector.

2. The isolation method of claim 1 further comprising the steps of:
   removing additional portions of the dual-tone resist that were beneath the first mask during the step of exposing the dual-tone resist; and
   forming a doped semiconductor region in the exposed substrate, the doped semiconductor region being aligned relative to the second isolation region.

3. The isolation method of claim 2 wherein the step of forming a doped semiconductor region in the exposed substrate comprises forming the doped semiconductor region by ion implantation.

4. The isolation method of claim 3 wherein the step of forming a doped semiconductor region in the exposed substrate comprises making a p-type doped semiconductor region by ion implantation to form a p-type intrinsic base.

5. The isolation method of claim 2 further comprising the step of forming at least one additional doped semiconductor region to form a bipolar device.

6. The isolation method of claim 5 wherein the second isolation region forms an isolation ring around the bipolar device.

7. The isolation method of claim 1 wherein the first mask is constructed of chrome.

8. The isolation method of claim 2 wherein the step of removing additional portions of the dual-tone resist that were beneath the first mask during the step of exposing the dual-tone resist includes the steps of:
   blanket exposing the dual-tone resist;
   developing the blanket exposed dual-tone resist; and
   removing the additional portions of the dual-tone resist.

9. The isolation method of claim 1 wherein:
   the first mask masks a contiguous area on the substrate to be used for a bipolar device, the perimeter of the contiguous area corresponding to the edge of the first mask;
   the first isolation region is a shallow trench isolation region surrounding the contiguous area; and
   the second isolation region and the first isolation region cooperate to form an isolation ring for isolating the bipolar device from other devices on the substrate, the isolation ring surrounding the contiguous area and extending between the surface of the substrate and the sub-collector.

10. The isolation method of claim 1 wherein:

the first isolation region surrounds a contiguous area on the surface of the substrate, the first isolation region having an inner edge adjacent to the contiguous area; and the preselected distance from the edge of the first isolation region is a distance that is preselected to place the edge of the first mask sufficiently close to the inner edge of the first isolation region so that the removed portion of the dual-tone resist will be at least partly above the first isolation region.

11. The isolation method of claim 1 further including the step of forming a layer of polysilicon on the substrate, and wherein the dual-tone resist is formed over the polysilicon layer.

12. The isolation method of claim 11 wherein the second isolation region is formed by ion implantation through the layer of polysilicon.

13. The isolation method of claim 11 further including a step of etching away exposed areas of the layer of polysilicon prior to forming the second isolation region.

14. The isolation method of claim 11 further comprising the steps of:

removing additional portions of the dual-tone resist that were beneath the first mask during the step of exposing the dual-tone resist;

etching the polysilicon layer to expose the substrate in regions where the dual-tone resist has been removed; and forming a doped semiconductor region in the exposed substrate, the doped semiconductor region being aligned relative to the second isolation region.

15. A method comprising the steps of:

a) providing a substrate having a buried sub-collector and isolation regions;

b) forming a layer of polysilicon on the substrate;

c) forming a layer of dual-tone resist on the polysilicon layer;

d) exposing and developing the resist using a first mask having edges terminating a preselected distance from edges of the isolation regions, including removing developed resist; and e) implanting an isolation ring between the isolation regions and the sub-collector using remaining resist as a second mask.

16. The isolation method of claim 15 further comprising the steps of:

f) removing resist regions that were beneath the mask during the exposing step d);

g) etching exposed polysilicon for exposing the substrate; and h) implanting dopant into the exposed substrate for forming base regions.

* * * * *